(12) United States Patent
Bogusch

(10) Patent No.: US 6,934,926 B1
(45) Date of Patent: Aug. 23, 2005

(54) METHOD FOR COMPRESSING SERPENTINE TRACE ROUTING ON PRINTED CIRCUIT BOARDS

(75) Inventor: Ernest B. Bogusch, West Chester, PA (US)

(73) Assignee: Unisys Corporation, Blue Bell, PA (US)

( * ) Notice: Subject to any disclaimer, the term of this patent is extended or adjusted under 35 U.S.C. 154(b) by 308 days.

(21) Appl. No.: 10/324,449

(22) Filed: Dec. 20, 2002

(51) Int. Cl.[7] .................. G06F 17/50; H03K 17/693; H05K 1/00
(52) U.S. Cl. .................. 716/15; 361/748; 375/356; 713/503
(58) Field of Search .................. 716/15; 361/748; 375/356; 713/503

(56) References Cited

U.S. PATENT DOCUMENTS

| | | | |
|---|---|---|---|
| 5,307,381 A * | 4/1994 | Ahuja | 375/356 |
| 5,784,600 A * | 7/1998 | Doreswamy et al. | 713/503 |
| 6,573,757 B1 * | 6/2003 | Gallagher | 326/101 |

* cited by examiner

*Primary Examiner*—A. M. Thompson
(74) *Attorney, Agent, or Firm*—Michael B. Atlass; Mark T. Starr

(57) ABSTRACT

Serpentine trace patterns are used to add length to traces for matching delays to groups of signals on separate transmission pathways on circuit boards. By providing reverse coupling by patterning the traces in concentric fashion, this invention enables closer spacing between adjacent trace segments of the serpentine pattern.

17 Claims, 9 Drawing Sheets

METHOD FOR COMPRESSING SERPENTINE TRACE ROUTING ON PRINTED CIRCUIT BOARDS

This invention relates to the art of electrical signal path building and is particularly adapted to the placing of fixed signal traces on circuit boards and the like.

BACKGROUND OF THE INVENTION

Modern high speed electronic systems particularly computer systems very often require careful matching of printed circuit board trace lengths so the signal delays through there are identical. This is particularly true where there are multiple signal paths of a bus and where all of the signals sent through a bus at the same time are required to arrive at their destination port at an exact same time. Accordingly, equivalent lengths traces may be required. Often there will not be room on a circuit board for a set of 32 or 64 or some other number of parallel straight-line traces. A number of solutions have developed to enable the building of signal traces on circuit boards of particular lengths. One such example is found in NCR's U.S. Pat. No. 5,467,456 which details the use of serpentine traces for introducing signal delays in signal lines. Unisys also issued a patent in the area U.S. Pat. No. 6,256,769 showing a similar serpentine trace solution. Sun Microsystems has a patent U.S. Pat. No. 5,649,126 addressing related technical issues.

Through years of use of such solutions, certain inherent problems became apparent and more problematic as signal trace lines get smaller and closer together in order to save space on the circuit boards. Along with the obvious problem that serpentine patterns occupy more surface area than a straight line, the effect of the serpentine trace introduces effective propagation delay and signal integrity problems which do not occur with straight line traces. These effects are caused by self-coupling, or crosstalk, between the transmission wire carrying the signal onto the adjacent parallel transmission line segments. The effect of crosstalk on the adjacent coupled transmission line will produce a premature propagation of the signal from the source to the load. One solution already understood in the art is to space the serpentine lines apart from each other to eliminate the crosstalk effects. While this solution is helpful in some circumstances, as the space available on the board for the serpentine trace becomes reduced due to the economics of manufacturing and shrinking electronics, such solutions become unavailable. Often times there is just not enough room for routing serpentine traces on a single layer of the board and the adding of additional layers to the board to allow for such traces increases the complexity and cost of the printed circuit board with no substantial benefit other than to solve this problem.

SUMMARY OF THE INVENTION

By modifying the serpentine trace pattern, the effects of inductive and capacitive coupling, commonly known as crosstalk, may be eliminated or reversed and the premature signal propagation eliminated. Additionally, substantially less space is required using this new pattern to achieve the same length signal transmission line trace.

The pattern is generally a representation of a concentrically patterned set of lines. Within this invention pattern there is substantial room for variation. (By "concentrically" we mean concentric-like, since the traces actually coil in a single connected line pattern, generally about a central point). Use of such a pattern generally means that the end of the signal transmission line (i.e., the trace), or any other via site on the length of the trace, is going to be within the concentric pattern and to connect to it, one will have to go outside the two dimensional layer in which the trace is located.

BRIEF DESCRIPTION OF THE DRAWINGS

FIG. 5 is an illustration of a transmission line signal trace illustrating the crosstalk and signal pathways they are on.

DETAILED DESCRIPTION OF THE PREFERRED EMBODIMENTS

Figure 1A:
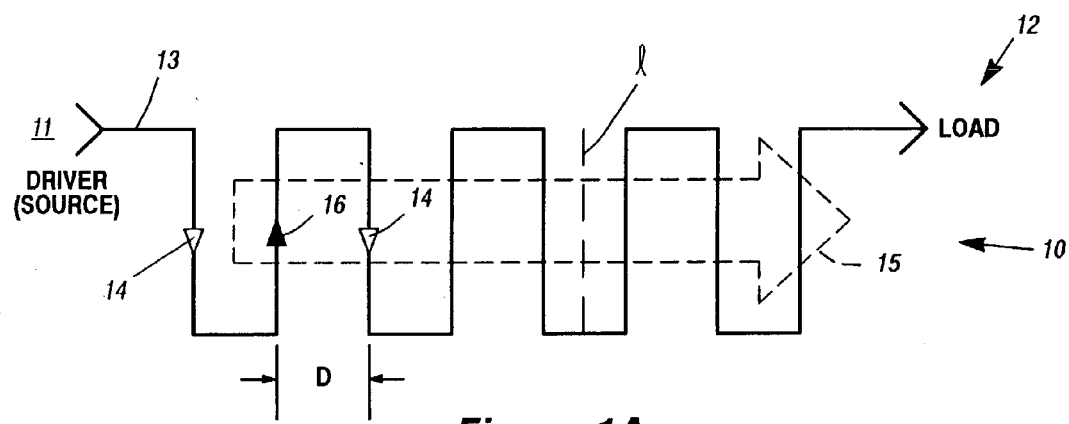
FIGS. 1A and B are a line drawings illustrating the propagation of signal through a serpentine trace from a driver or source to a receiver or load.
Figure 1B:
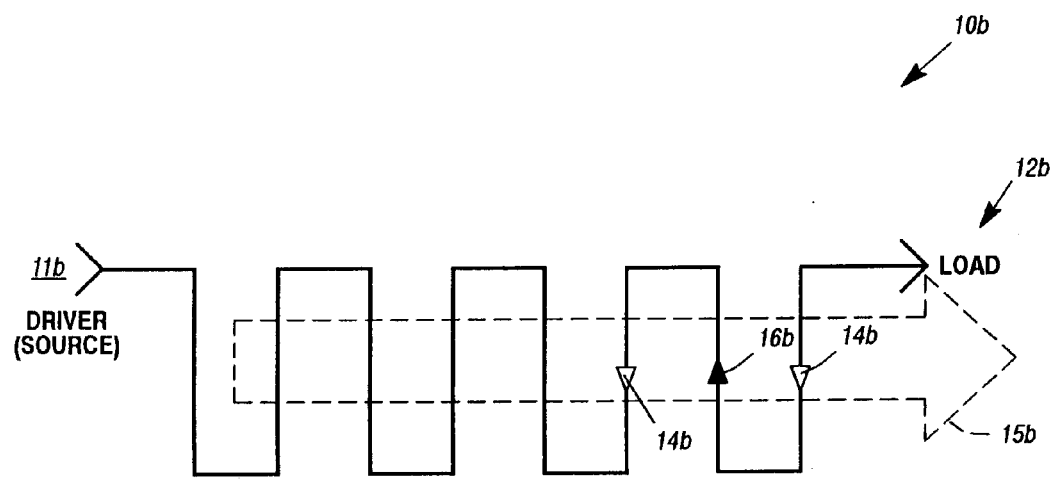

In FIGS. 1A and 1B idealized trace patterns 10 and 10B, respectively are illustrated, showing the input or driver (source) side 11 (and 11B in FIG. 1B), and the serpentine trace line 13 (and 13B, in FIG. 11B) leading to the load or receiver 12 (and 12B in FIG. 1B). The direction of signal propagation through the transmission line is illustrated by arrows 14", and the coupling crosstalk effects illustrated by arrows 14' are generated by the signal transmission through the parallel trace segments. In FIG. 1A we look at the crosstalk produced on two adjacent segments of the serpentine of lengths l; the crosstalk between the signal at an instant in time at 16 and the two reverse crosstalk arrows 14b which develop across the distance D on adjacent length segments on either side of the signal 16. (There is crosstalk between non-adjacent segments, but it is not significant in size). In FIG. 11B, we again see that the effect of the crosstalk between signal current flowing through adjacent segments (14b in two adjacent to the signal segment) but it becomes apparent that the effect is additive and cumulative, causing the crosstalk signal transmission 15b to some extent to propagate faster than the intended signal 16 in the forward direction. The practical effects of this are seen in FIGS. 2A–C discussed below.

Note that crosstalk can produce currents in the same direction and in the opposite direction of the signal current. The crosstalk current that is usually of most concern is reverse crosstalk, since it is traveling in the opposite direction of the signal current. The crosstalk current that is in the same direction of the signal current is called forward crosstalk, since the current is traveling in the same direction as the signal current. In the most common physical geometry of a trace, a stripline, no forward crosstalk occurs In a microstrip construction forward crosstalk occurs along with reverse crosstalk. But, the forward crosstalk is much smaller in amplitude and occurs for a smaller time then reverse crosstalk For this reason, the effect of forward crosstalk can be ignored and it has no relevant effect for the purposes of this patent. This invention preferably is applied to either a stripline or a microstrip trace construction or other related technologies.

To be more specific, the load effect is that the signal provided by the driver will propagate along the path of the trace and also through the crosstalk which is parallel to the coupled length segments. This crosstalk propagation is illustrated in dotted line arrow 15 (and 15B). It is well known that increasing the size of the Distance D between these parallel segment lengths will reduce or eliminate the signal propagation through means of crosstalk parallel to the coupled sections. As outlined in the background section above, as the traces get smaller and the available circuit board area becomes less as technology improves, there is less available space between parallel segment lengths and a solution was required.

Figure 2A:
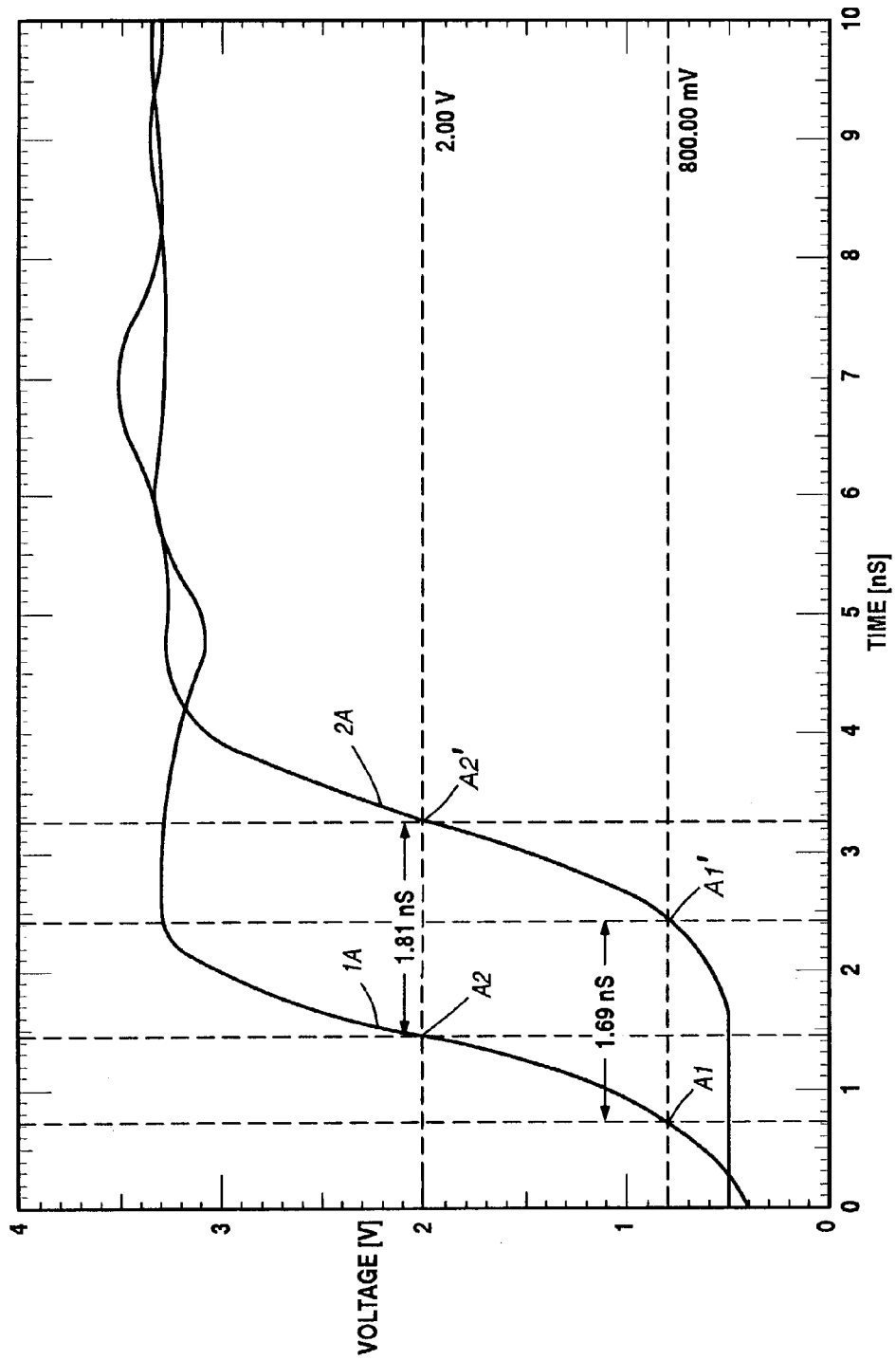
FIGS. 2A, 2B, and 2C are graphs of signal propagation times corresponding to three different transmission line trace patterns.
Figure 2B:
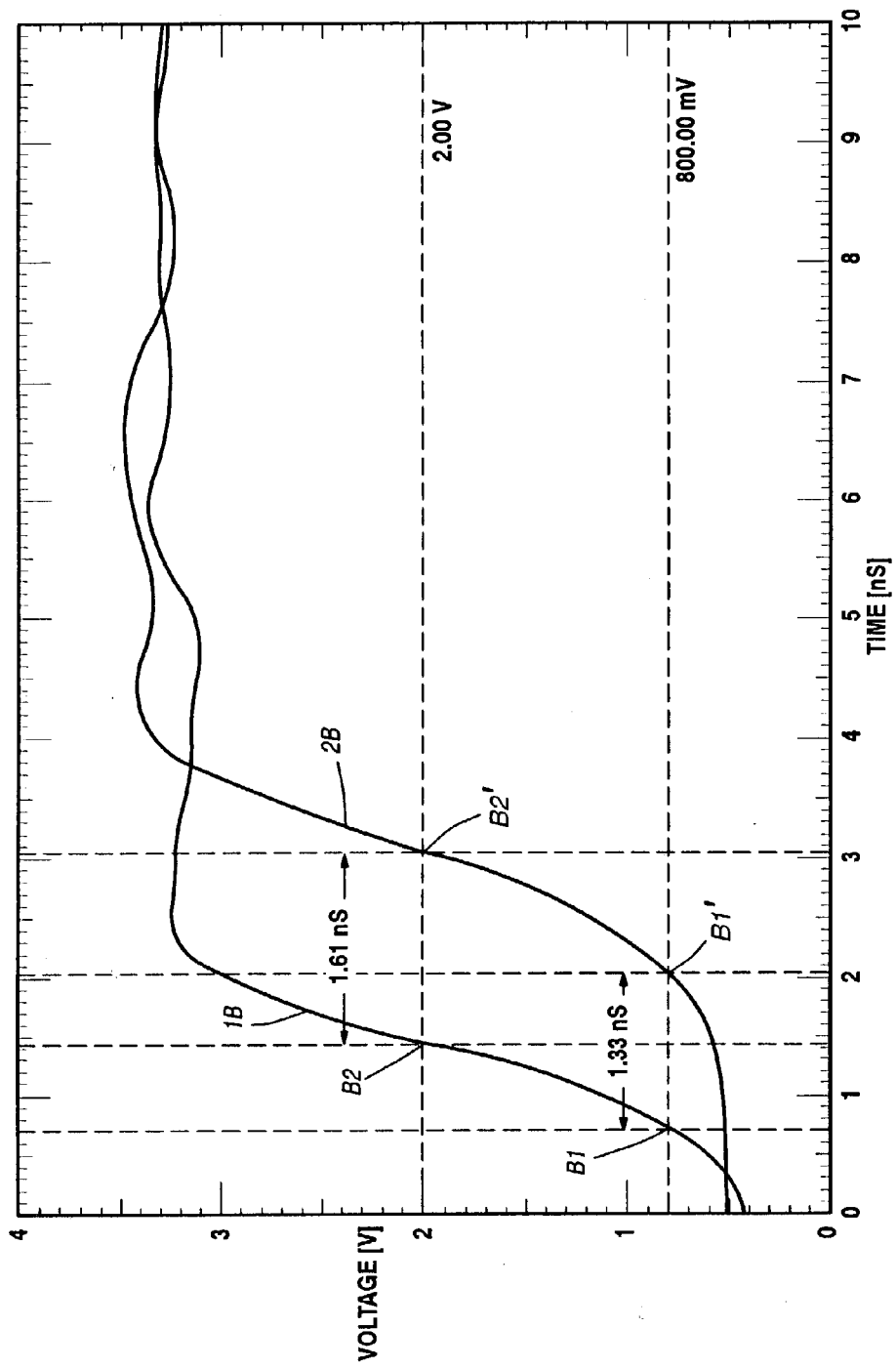
Figure 2C:
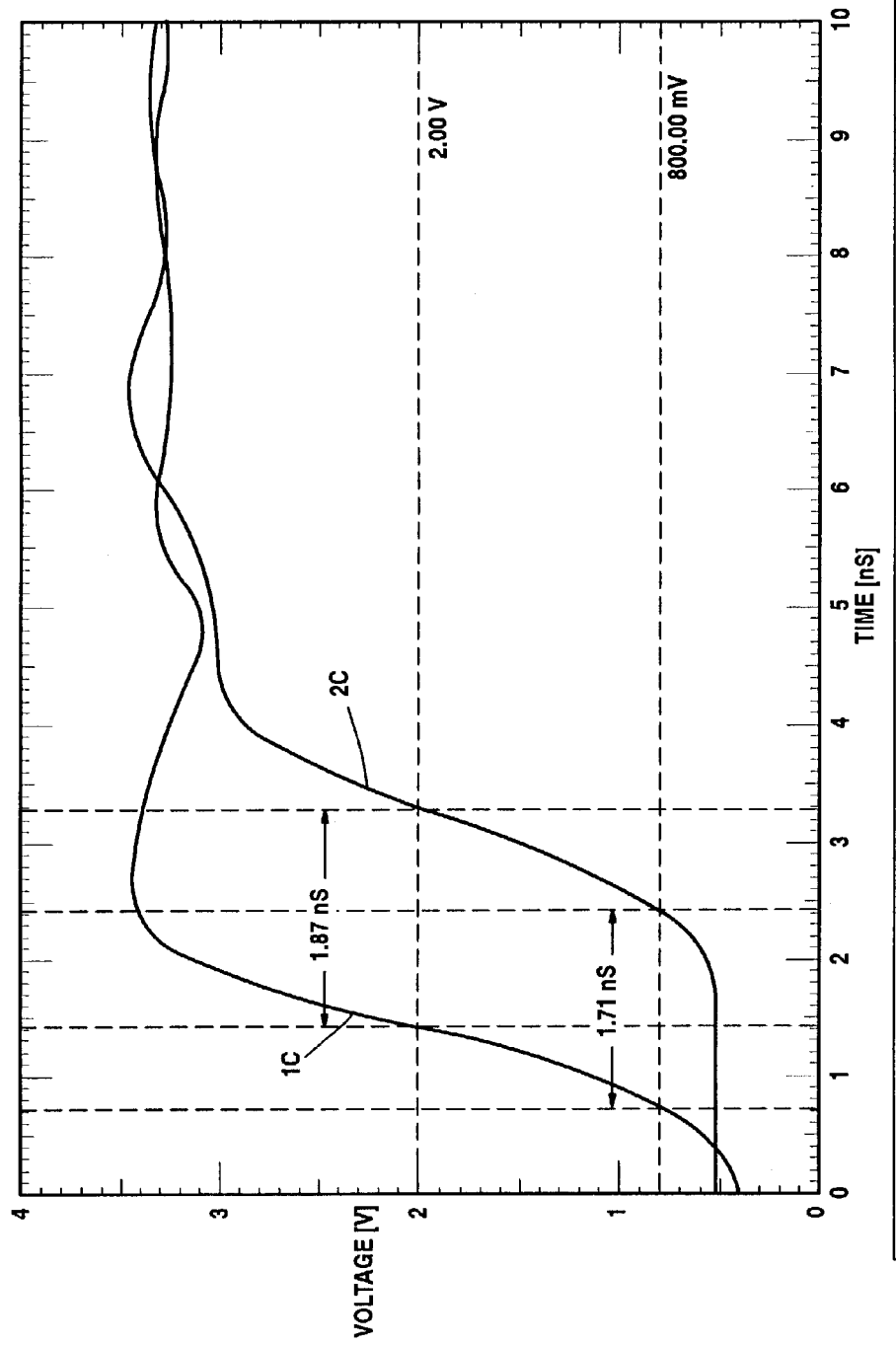

The effect of the signal propagation through crosstalk can be clearly seen in circuit simulations shown in FIGS. 2A–C, which illustrate the time lag from initiation of a signal from a source to its receipt at the load, in three serpentine patterns of equal length. In FIG. 2A, the serpentine pattern on which the graph's measurements are based is a normal serpentine pattern having three parallel segments each three inches long with these parallel segments spaced apart at 25 mils. The total length of this trace is nine inches. The voltage level is illustrated on the left hand side of the graph and the time (from zero) for a signal to reach a particular voltage is illustrated on the horizontal time access. In the FIGS. 2A–C we use two measurements to show propagation delay. The first delay measurement will be at 0.8 volts and the second delay measurement will be at the 2.0 volt level. In FIG. 2A, (25 mil serpentine spacing, which is equivalent to a straight line trace having a total length of nine inches) the propagation delay at the 0.8 volt level is 1.69 ns (time difference between points A1 and A1') At the 2.0 volt level the propagation delay is 1.81 ns (time difference between points A2 and A2'). In FIG. 2B the serpentine trace is identical in length to the trace in FIG. 2A except the trace spacing is reduced to 5 mils. In this case, using the same measurement techniques as in FIG. 2A the propagation delay at 0.8 volt level has been reduced by 0.36 ns to 1.33 ns (B2-B2'). At the 2 volt level the propagation level has been reduced by 0.2 ns to 1.61 ns(B1-B1'). FIG. 2C shows the results of the same 9 inch trace using a modified serpentine trace layout of the invention (i.e. concentrical or coiled layout) spaced at 5 mils in lines 1C and 2C. The propagations delay at 0.8 volts of 1.71 ns and at the 2.0 volt level of 1.87 ns. Notice that there is no reduction in propagation delay, in fact there is a slight increase of delay of 0.02 ns and 0.07 ns respectively over the original serpentine trace routed at 25 mil separation.

Figure 3:
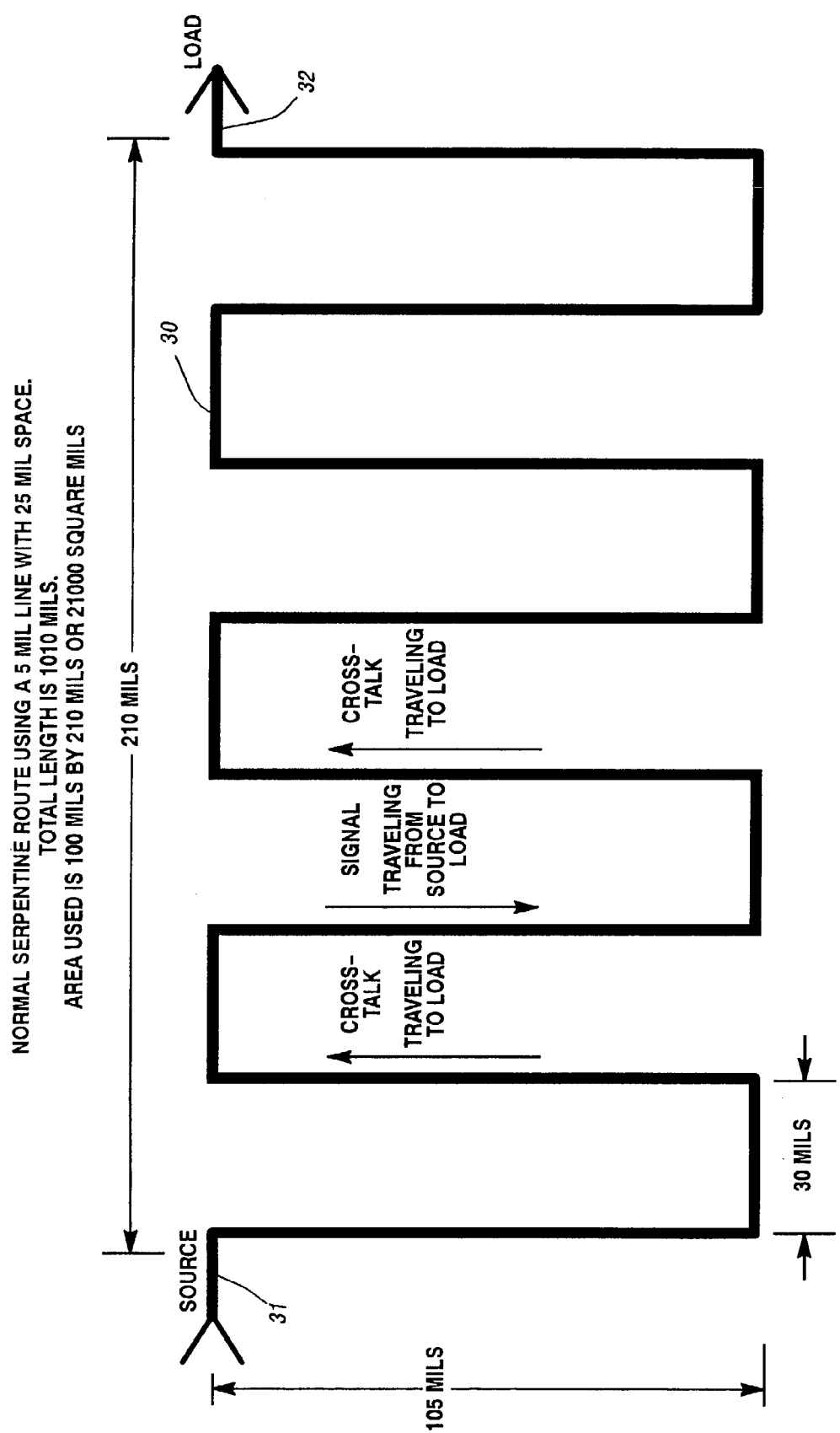
FIG. 3 is a signal transmission line trace pattern illustration.
Figure 4:
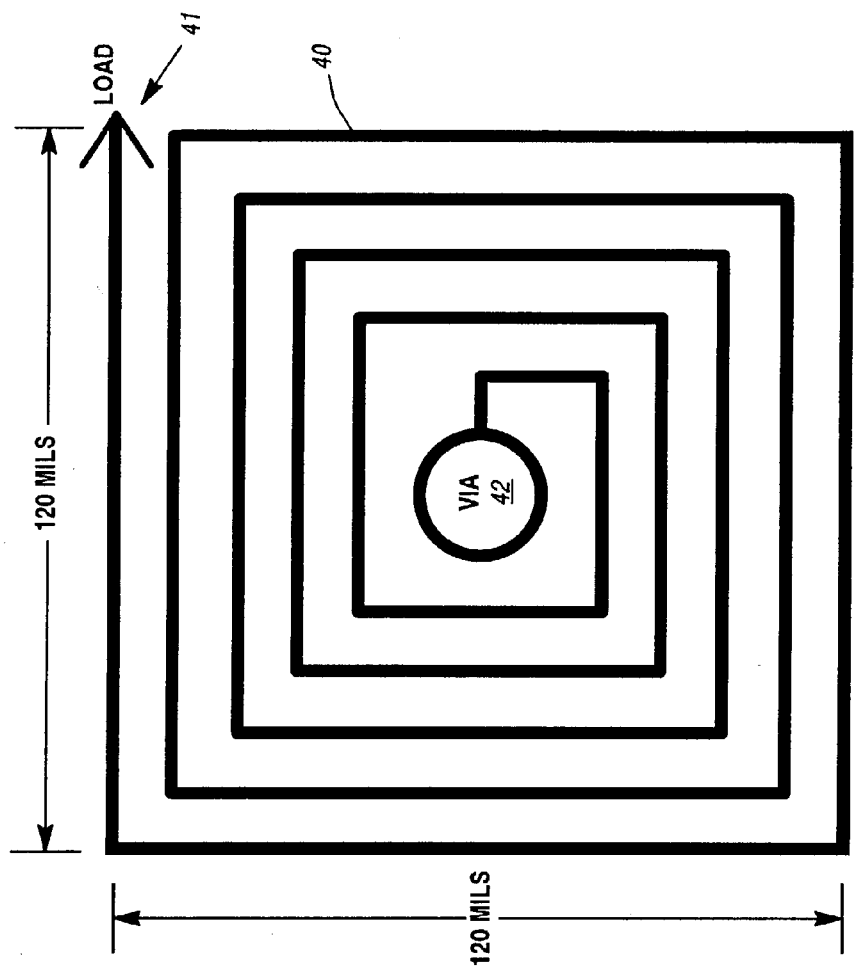
FIG. 4 is an illustration of a signal line trace pattern in accord with a preferred embodiment of the invention.
Figure 5:
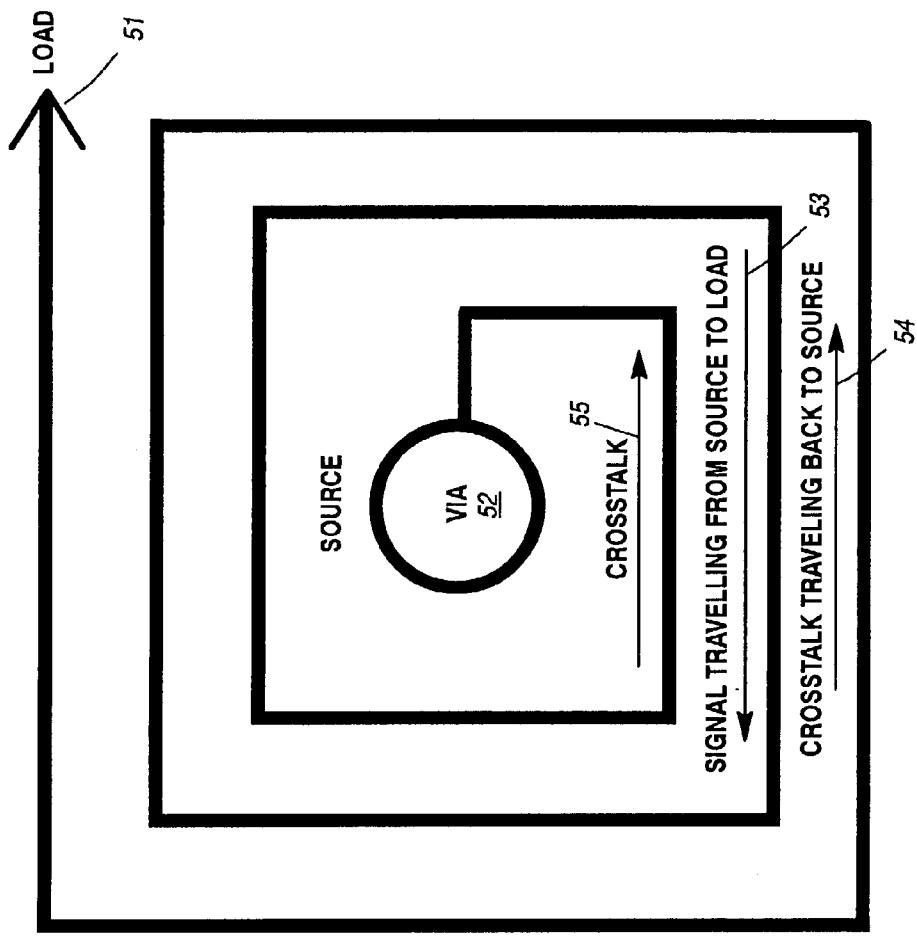

The comparison of the traditional serpentine pattern versus the inventive serpentine pattern should be now made with an emphasis on the space saving characteristics of the inventive pattern. In FIG. 3 a normal serpentine route for a transmission line trace 30 is illustrated. This routing uses a 5 mil line with a 25 mil space between parallel lengths. The length of the routing is 1,010 mils. The area used for this total length is 100 mils by 210 mils or 21,000 square mils. Refer now to FIG. 4 in which a modified serpentine pattern using a 5 mil line with only 5 mil spacing produces 2,000 mils total length in an area 120 mils by 120 mils or 14,400 square mils. FIG. 5 illustrates a compressed (inventive) serpentine route of a tracing 50 which produces non-additive reverse crosstalk that travels back to the source, thus eliminating the possibility of premature propagation of the signal. Arrow 53 indicates the direction of the signal traveling from the source 52 to the load 51. The reverse crosstalk 55 and 54 travels back to the source from the area of the signal 53 within the circuit trace 50.

Figure 6A:
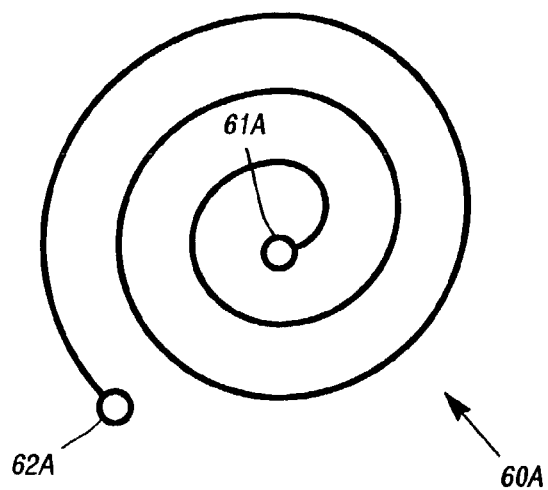
FIGS. 6A–D illustrate variations on preferred embodiments of the invention.
Figure 6B:
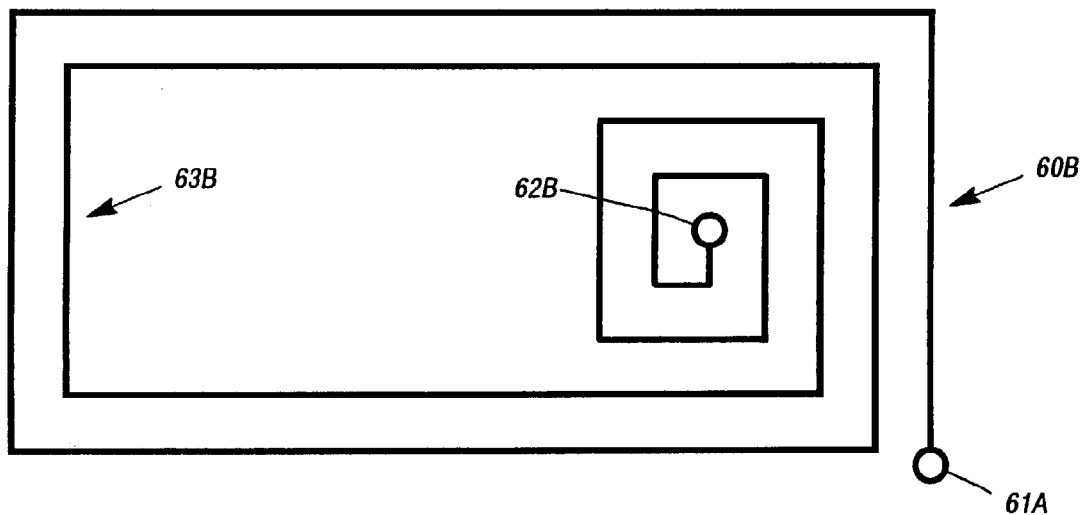
Figure 6C:
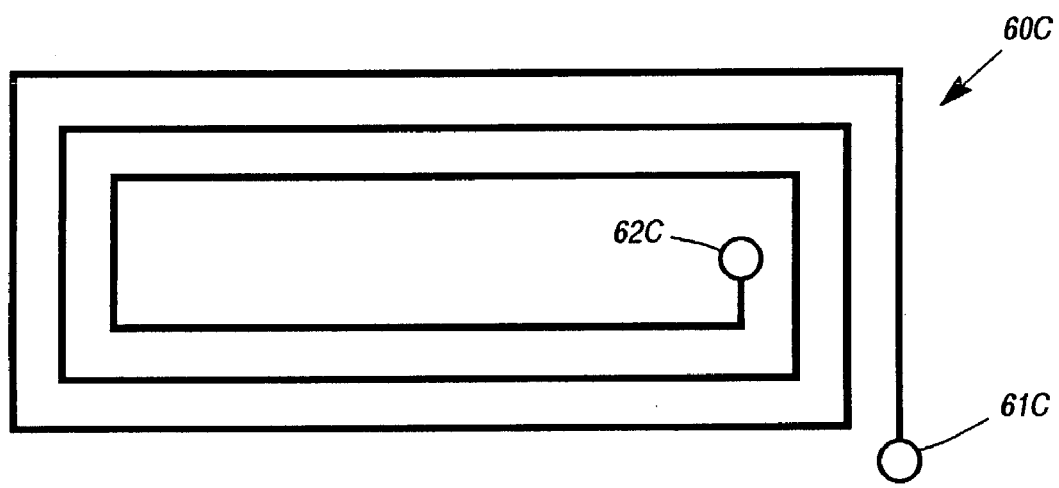
Figure 6D:
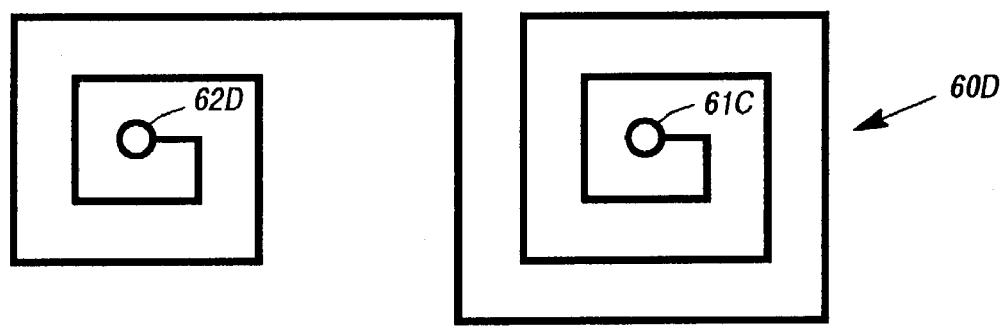

Note that the general pattern illustrated in FIGS. 4 and 5, can be modified to a substantial degree and still retain the reverse crosstalk effects and reduced signal path area as illustrated in FIGS. 6A–D. In FIG. 6A, the circuit tracing 60A is similar to a set of coiled or concentric circles. The source is located in the center 61A and at one end is the load 62A. A more fanciful modification is shown in FIG. 6B where the tracing 60B has a bunched concentricity around the source 62B and an extended rectangular area 63B before getting to the load 61B. A simple rectangular pattern is illustrated in FIG. 6C as pattern 60C is illustrated with its source 61C and load 62C. In FIG. 6D, an interesting pattern 60D has a source 62D and a load 61D both located in counter rotated concentric patterns. Use of counter or alternating concentricities may provide smoothing characteristics to the overall signal integrity.

Note, that in all of these patterns reversing the direction of the crosstalk allows the crosstalk to travel back towards the driver where it has no detrimental effect on the signal delay and minimal effect on the signal integrity. Since the reverse traveling crosstalk does not negatively affect the signal, the compressed serpentine routing can be routed at minimum spacing allowed for signal propagation and the amount of routing area required for the signal trace will be greatly reduced. At 5 mil spacing, (for lines of 5 mil thickness) the compressed serpentine routing will save approximately 75% of the area required for a 25 mil normal serpentine routing. This reduction in area can have a large impact on a very complex circuit board where (especially in computer systems having multiple buses), serpentine routing can exceed 50% of the traces on such a board.

It should be noted that whether it is the source the load, or between the source and load the area of the inventive trace pattern which is located in the center of a concentricity or coil, will require a via. At either the source or the load ends the via may be the same via used for connecting the appropriate component to that part of the circuit trace. If the inventive trace pattern between the source and the load end points, the required via will provide a transition from one signal routing layer to a second signal routing layer. It should also be noted that application specific integrated circuit (ASIC) packages and even large FPGA packages use trace patterns similar to printed circuit boards, and that in some cases trace routing in these packages may require serpentine trace patterns. Thus the inventive compressed serpentine routing could also be used in ASIC packages to equalize signal delays of signals belonging to a common bus. Accordingly, application of the invention to such media is encouraged. Further, the design of actual circuit traces within chips themselves, when those chips are built in multiple layers having the availability of vias to transport signals from one layer to another, the application of this invention to such traces is also warranted.

It should also be noted that the purposeful introduction of electrical coupling provided by the patterns described in this patent may be used to add additional electrical delay beyond the normal trace delay to a signal where slight degradation of signal integrity is not a problem for the particular circuit The invention having been described in sufficient detail to evaluate one of ordinary skill in these arts to practice it, its scope is limited only by the following appended claims.

What is claimed is:

1. A circuit board having thereon at least one set of matched length signal transmission lines wherein at least one member of said set is laid out at least partially in a coiled, generally concentrically patterned run between a load end and a source end.

2. A circuit board having thereon at least one set of matched length signal transmission lines wherein at least one member of said set is laid out at least partially in a concentrically patterned run between a load end and a source end.

3. A circuit board as set forth in claim 2 wherein said concentrically patterned run is a square pattern and wherein one of said ends is located within said concentrically patterned run.

4. A circuit board as set forth in claim 2 wherein said concentrically patterned run is at least partially a rectangular pattern and wherein one of said ends is located within said concentrically patterned run.

5. A circuit board as set forth in claim 2 wherein said concentrically patterned run is at least partially a coiled curve and wherein one of said ends is located within said concentrically patterned run.

6. A circuit board as set forth in claim 2 wherein said concentrically patterned run has both of said ends located within said concentrically patterned run.

7. A circuit board as set forth in claim 2 wherein spacing between adjacent traces within said concentrically patterned run are on the order of 5 mils.

8. A circuit board as set forth in claim 2 wherein spacing between adjacent traces within said concentrically patterned run are on the order of the width of said traces.

9. A circuit board having thereon at least one set of matched length signal transmission lines wherein at least one member of said set is laid out in at least two portions in concentrically patterned runs between a load end and a source end, and wherein one of said at least two portions contains therewithin said source end and wherein another of said at least two portions contains therewithin said load end.

10. A circuit trace medium having at least one plurality of matched signal transmission lines, wherein at least one member of said at least one plurality is laid out at least partially in a concentrically patterned run between a load end and a source end.

11. A circuit trace medium as set forth in claim 10 wherein said signal transmission lines are traces and said medium is a circuit board.

12. A circuit trace medium as set forth in claim 10 wherein said medium is a laminated ASIC connector.

13. A circuit trace medium as set forth in claim 10 wherein said medium is a semiconductor chip.

14. A method of producing a circuit trace for limited length transmission lines requiring compaction into a limited circuit board area comprising:
  laying out at least one portion of a run of said limited length transmission line in a coiled run, said coiled run being at least partly in a concentric pattern, between a load end and a source end.

15. A method of producing a circuit trace for limited length transmission lines requiring compaction into a limited circuit board area comprising:
  laying out at least one portion of a run of said limited length transmission line in a concentrically patterned run between a load end and a source end.

16. The method of claim 15 wherein spacing between adjacent traces within said concentrically patterned run are on the order of 5 mils.

17. The method of claim 15 wherein spacing between adjacent traces within said concentrically patterned run are on the order of the width of said traces.

* * * * *